United States Patent [19]
Yokotsuka et al.

[11] Patent Number: 5,164,950
[45] Date of Patent: Nov. 17, 1992

[54] SEMICONDUCTOR LASER DEVICE COMPRISING A SIGE SINGLE CRYSTAL SUBSTRATE

[75] Inventors: Tatsuo Yokotsuka, London, England; Masato Nakajima, Kawasaki, Japan

[73] Assignee: Matsushita Electric Industrial Co., Ltd., Osaka, Japan

[21] Appl. No.: 709,841

[22] Filed: Jun. 4, 1991

[30] Foreign Application Priority Data

Jun. 5, 1990 [JP] Japan .................. 2-148288

[51] Int. Cl.⁵ .............................................. H01S 3/17
[52] U.S. Cl. ................................. 372/45; 372/46; 252/200; 252/616
[58] Field of Search ............... 372/45, 46; 357/4, 16, 357/17

[56] References Cited

U.S. PATENT DOCUMENTS 4,897,699  1/1990  Razeghi et al. ............... 357/17

FOREIGN PATENT DOCUMENTS

| 0259026 | 3/1988 | European Pat. Off. |
| 58-021320 | 2/1983 | Japan. |
| 58-191421 | 11/1983 | Japan. |
| 59-086281 | 5/1984 | Japan. |
| 63-081990 | 4/1988 | Japan. |
| 63-197391 | 8/1988 | Japan. |
| 0318273 | 12/1989 | Japan .................. 372/45 |

OTHER PUBLICATIONS

"Strong Ordering in GaInP Alloy Semiconductors", by T. Suzuki et al.; Journal of Crystal Growth 93(1988), pp. 396-405.

Electronics Letters, vol. 25, No. 14, Jul. 6, 1989, Stevenage, Herts., GB, pp. 905-907; T. Tanaka.: 'Lasing Wavelengths of Index-Guided AlGaInP Semiconductor Lasers as Functions of Off-Angle from (100) Plane of GaAs Sebstrate'.

*Primary Examiner*—Georgia Y. Epps
*Attorney, Agent, or Firm*—Lowe, Price, LeBlanc & Becker

[57] ABSTRACT

A semiconductor laser device which comprises a monocrystal substrate of consisting essentially of $Si_aGe_{1-a}$, wherein $0 \leq a \leq 0.25$, and a compound semiconductor layer which is formed on one side of the substrate and is lattice-matched with the substrate. The compound semiconductor layer includes an Al-free active layer made of $Ga_bIn_{1-b}P$ wherein $0.51 < b \leq 0.64$ and the first and second clad layers sandwiching the active layer therebetween wherein said first clad layer is formed on the one side of the substrate. The first and second clad layer are each made of $(Al_oGa_{1-o})_dIn_{1-d}P$, wherein $0.4 \leq c \leq 1$ and $0.51 < d \leq 0.64$.

7 Claims, 2 Drawing Sheets

SEMICONDUCTOR LASER DEVICE COMPRISING A SIGE SINGLE CRYSTAL SUBSTRATE

BACKGROUND OF THE INVENTION

1. Field of The Invention

This invention relates to a light-emitting device and more particularly, to a semiconductor laser device.

2. Description of the Prior Art

One of typical known materials for visible light semiconductor laser devices is $(AlGa)_{0.5}In_{0.5}P$. When this semiconductor material is used as a semiconductor laser device, it is epitaxially grown on a substrate which is usually made of GaAs. Except for nitrides, $(AlGa)_{0.5}In_{0.5}P$ compounds have the highest band gap energy among those compounds of the elements of Group III-V of the Periodic Table. Accordingly, they are generally used as a semiconductor laser device capable of emitting a laser beam in a red color region. In general, the substrates on which compound semiconductors are deposited by epitaxy include, aside from GaAs, InP, GaP, GaSb, Si and Ge. For the expitaxial growth of (AlGa) InP materials, it has been generally accepted that the substrate should be made of GaAs from the standpoint of the lattice constant matching. Where (AlGa) InP is epitaxially grown on the GaAs substrate, the smallest band gap energy is 1.91 eV for $Ga_{0.5}In_{0.5}P$ and the largest band gap energy is 2.35 eV for $Al_{0.5}In_{0.5}P$.

There is a recent tendency of semiconductor laser devices toward a shorter wavelength of lasing. For realizing the short lasing wavelength, the band gap energy of an active layer, serving as a light-emitting portion, should be great. The active layer should be made of a material of the direct transient type for the generation of a laser beam and should have a hetero structure in order to confine light and a charge current within a narrow region. Moreover, clad layers between which the active layer is sandwiched have a band gap energy which is larger by 0.25 eV or over than that of the active layer.

For the reasons set out above, a short lasing wavelength in the semiconductor laser devices using the GaAs substrate has now been realized by increasing the content of Al in the active layer and the clad layers, thereby increasing the band gap energies.

However, the increase of the band gap energies by the increase in content of Al is limited: the maximum band gap energy is only 2.35 eV for $Al_{0.5}In_{0.5}P$ wherein the band gap energy of the active layer is 2.10 eV. The lasing wavelength is 590 nm.

Although the increasing content of Al is effective in attaining a short wavelength as stated above, there arises the problem that oxidation takes place in the semiconductor laser device during working operations, resulting in considerable degradation of the characteristics. Thus, the device is not reliable.

SUMMARY OF THE INVENTION

It is accordingly an object of the invention to provide a semiconductor laser device which is adapted for realizing a short lasing wavelength without involving the problems as in prior art such as of oxidation of compound semiconductor layers, and is thus reliable.

It is another object of the invention to provide a semiconductor laser device which includes an active layer free of aluminium whereby good characteristic properties of the device are ensured without degradation of the active layer through oxidation.

Broadly, the present invention provides a semiconductor laser device which comprises a monocrystal substrate consisting essentially of $Si_aGe_{1-a}$, wherein $0 < a \leq 0.25$, and a compound semiconductor layer which is formed on one side of the substrate, is lattice-matched with the substrate and includes an Al-free active layer made of $Ga_bIn_{1-b}P$ wherein $0.51 < b \leq 0.64$ and first and second clad layers sandwiching the active layer therebetween, the first clad layer being formed on the substrate, each clad layer being made of $(Al_oGa_{1-o})_dIn_{1-d}P$, wherein $0.4 \leq c \leq 1$ and $0.51 < d \leq 0.64$.

DETAILED DESCRIPTION AND EMBODIMENTS OF THE INVENTION

A prior art semiconductor laser device is first described with reference to FIG. 2.

Figure 2:
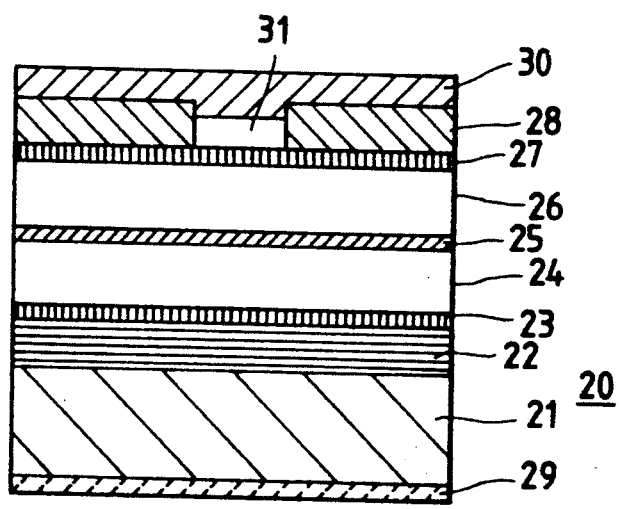
FIG. 2 is a schematic sectional view of a known semiconductor device.

In FIG. 2, there is shown a semiconductor laser device 20 which includes a GaAs substrate 21 having an n-type buffer layer 22, an n-type GaInP layer 23, an n-type AlGaInP clad layer 24, an active layer 25, a p-type AlGaInP clad layer 26, a p-type GaInP layer 27, and an insulating layer 28 in this order. Reference numerals 29 and 30 are, respectively, n-type and p-type electrodes provided as shown in the figure. Reference numeral 31 indicates a contact layer made of p-GaAs.

The individual layers are epitaxially grown on the substrate by an ordinary manner on the plane (001) of the substrate 21. If, for example, the active layer is made of $Ga_{0.5}In_{0.5}P$, the lasing wavelength is 650 nm.

Figure 3:
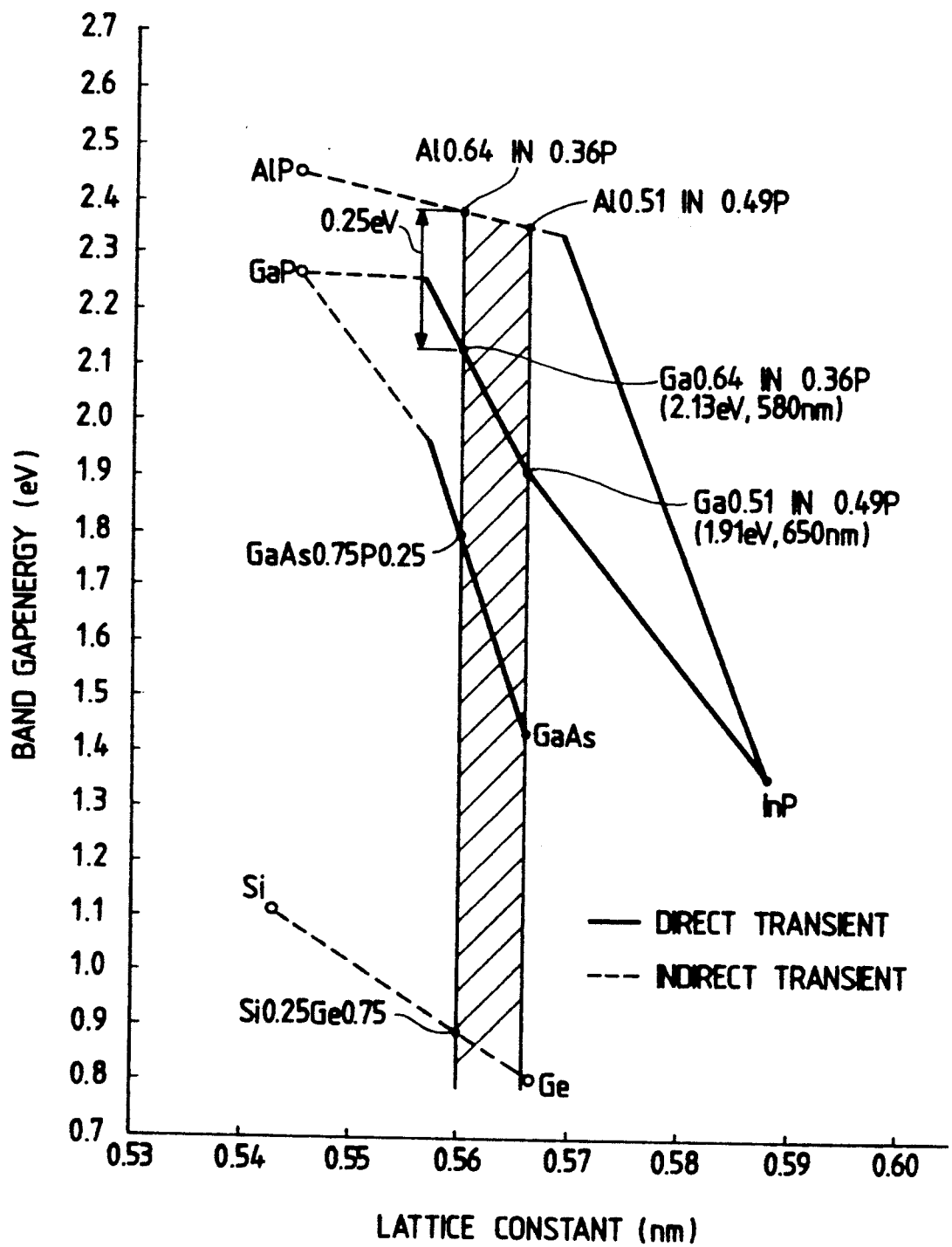
FIG. 3 is a graphical representation of the band gap energy in relation to the variation in the lattice constant for different semiconductive compositions.

Reference is now made to FIGS. 2 and 3 wherein embodiments of the invention are described.

Figure 1:
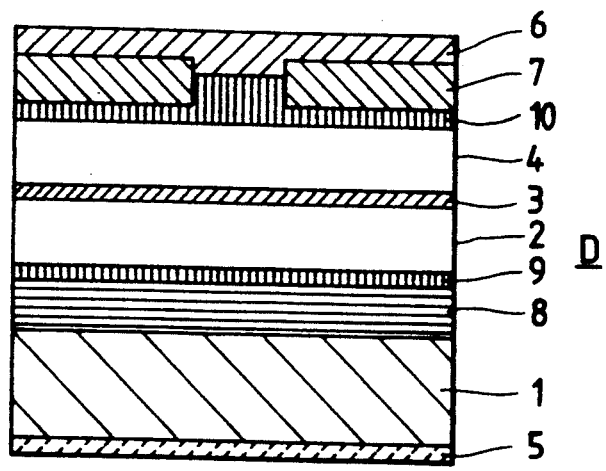
FIG. 1 is a schematic sectional view of a semiconductor laser device according to an embodiment of the invention.

In FIG. 1, there is generally shown a semiconductor laser device D according to the invention which is similar to the structure of the known device illustrated with reference to FIG. 2.

Fundamentally, the device D of the invention includes a monocrystal substrate 1 made of SiGe which may be of the n or p-type. The substrate 1 has a clad layer 2, an active layer 3 and a clad layer 4 formed on one side thereof in this order. An electrode 5 is formed on the other side of the substrate 1 and an electrode 6 is formed on the clad layer 4 through an insulating layer 7 to complete the semiconductor laser device D. Preferably, a buffer layer 8 is provided between the substrate 1 and the clad layer 2. An intermediate layer 9 may be provided between the buffer layer 8 and the clad layer 2 in order to reduce the difference in band gap energy between the layers 8 and 2. Reference numeral 10 indicates a contact layer between the electrode 6 and the clad layer 4.

In the practice of the invention, it is essential that the substrate 1 be made of $Si_aGe_{1-a}$, wherein $0 < a \leq 0.25$. The SiGe material for the substrate may be of either the n type or the p type. If the n type material is used, the layers 2, 9 and 8 should be made of semiconductor materials of the n-type whereas the layers 4, 10 should be made of semiconductor materials of the p type. With the p-type substrate, the above is reversed. On the substrate are epitaxially formed the layers set out above wherein the (001) plane is used for the epitaxial growth.

The clad layers 2, 4 are each made of a compound semiconductor of the formula, $(Al_oGa_{1-o})_dIn_{1-d}P$, wherein $0.4 < c \leq 1$ and $0.51 < d \leq 0.64$. Preferably, $0.4 \leq c \leq 1$. As will be seen from the formula, AlInP or GaInP may be used as the clad layers although lattice matching with the substrate has to be taken into consideration. For making n-type and p-type conductivities, impurities such as Si, S and the like are incorporated in the compound semiconductor for the n-type conductivity at a concentration of $2 \times 10^{17}$ to $5 \times 10^{18}$ atoms/cm$^3$. Likewise, for the p-type conductivity, impurities such as Be, Mg and the like are incorporated in the compound semiconductor at a concentration of $2 \times 10^{17}$ to $5 \times 10^{18}$ atoms/cm$^3$.

For the formation of the clad layer 2 by epitaxy, attention should be paid to the lattice matching with the substrate as will be discussed hereinafter. The clad layers 2, 4 are generally formed in a thickness of from 0.6 to 1.0 micrometers.

The active layer 3 is made of a compound semiconductor of the formula, $Ga_bIn_{1-b}P$, wherein $0.51 < b \leq 0.64$. Within this range, the lattice matching with the substrate is satisfied and the band gap energy, Eg, can be varied such that $1.91 \text{ eV} \leq Eg \leq 2.13$. In other words, the lasing wavelength, $\lambda$, can be controlled within a range of from 650 nm to 580 nm using a compound semiconductor free of an Al in the active layer 3. The active layer 3 is generally formed in a thickness of from 400 to 1000 angstroms.

The electrodes 5 and 6 are made of any known material such as AuGe, AuZn and the like and may be formed by any known technique.

If necessary, the insulating layer 7 may be provided between the clad layer 4 and the electrode 6 and is made of a material such as $SiO_2$, $Si_3N_4$ and the like as usual.

In order to cause the epitaxial growth of the layers, 2, 3, 4, 10, 7 and 6 to proceed smoothly, it is preferred to form the buffer layer 8. The buffer layer 8 may be formed of GaAsP, SiGe or GaInP whose composition depends mainly on the composition of the substrate 1. Preferably, the buffer layer is made of $Si_eGe_{1-e}$, wherein $0 < e \leq 0.25$, $GaAs_fP_{1-f}$ wherein $0.75 \leq f \leq 1$, or $Ga_gIn_{1-g}P$ wherein $0.51 \leq g \leq 0.64$. This layer 8 is formed in a thickness of from 0.2 to 0.3 micrometers.

Where the buffer layer 8 is made of a material other than the GaInP, an intermediate layer 9 may be formed between the buffer layer 8 and the clad layer 2 to reduce the energy gap therebetween. In this sense, it is more preferred that the buffer layer 8 is made of GaInP defined above.

The contact layer 10 is made of GaInP as used for buffer layer 8.

Fabrication of the semiconductor laser device according to the invention is performed without resorting to any specific technique and is not particularly described herein.

When the SiGe material is used as the substrate, a ternary semiconductor of GaInP used as the active layer should contain Ga in large amounts in order to permit lattice matching with the substrate. This is particularly shown in FIG. 3, which shows the relation between the band gap energy and the lattice constant for different compound semiconductors. In the figure, when the content of In in the GaInP semiconductor is increased, the lattice constant increases. On the other hand, when the content of Ga is increased, the lattice constant decreases.

Taking into consideration the lattice matching of the substrate with the clad layer and the active layer and the difference in band gap energy between the clad layer and the active layer, the lattice constant of the semiconductor of $Si_aGe_{1-a}$ should be in the range of from 0.560 to 0.56575. This corresponds to the semiconductor composition of $Si_aGe_{1-a}$ wherein $0 < a \leq 0.25$ as will be apparent from FIG. 3. At $a = 0.25$, the shortest lasing wavelength is obtained. Thus, $a = 0.25$ is preferred.

Likewise, in order to satisfy the lattice constant requirement, $0.51 < b \leq 0.64$ for $Ga_bIn_{1-b}P$, and $0.4 \leq c \leq 1$ and $0.51 < d \leq 0.64$ for $(Al_oGa_{1-o})_dIn_{1-d}P$.

By this, the clad layer consisting of $(Al_oGa_{1-o})_dIn_{1-d}P$ and the active layer consisting of $Ga_bIn_{1-b}P$ can be appropriately epitaxially grown on the SiGe substrate while the lattice constants are matched so that smooth epitaxial growth is ensured.

The band gap energy of the active layer can be varied within a range of from 1.91 eV to 2.13 eV. The Al-free semiconductor is used as the active layer to control the lasing wavelength, $\lambda$, in the range of 650 nm $\geq \lambda \geq$ 560 nm.

The present invention is more particularly described by way of example.

EXAMPLE

A $Si_{0.25}Ge_{0.75}$ substrate having a lattice constant of 0.56 was provided, on which a $GaAs_{0.75}P_{0.25}$ buffer layer was epitaxially grown in a thickness of 2000 angstroms, followed by further formation of an n-type $Al_{0.64}In_{0.36}P$ clad layer and a $Ga_{0.64}In_{0.36}P$ active layer by epitaxy. Thereafter, a p-type $Al_{0.64}In_{0.36}P$ clad layer was further formed. An insulating layer and electrodes were formed as shown in FIG. 1 to obtain a semiconductor laser device. The lasing wavelength of the device was as short as 580 nm. It will be noted that the band gap energy between the active layer and the clad layer was 0.25 eV.

The above procedure was repeated except that the buffer layer was made of $Si_{0.25}Ge_{0.75}$ or $Ga_{0.64}In_{0.36}P$, with similar results.

Thus when the SiGe monocrystal substrate is used in the AlGaInP semiconductor laser device, lasing at a short wavelength can be realized without use of aluminium in the active layer. The laser device suffers little degradation of the performance owing to oxidation during operations and is thus highly reliable.

What is claimed is:

1. In a semiconductor laser device, a substrate and a semiconductor layer structure comprising a monocrystal substrate consisting essentially of $Si_aGe_{1-a}$, wherein $0 < a \leq 0.25$, and a compound semiconductor layer which is formed on one side of the substrate and is lattice-matched with the substrate, said compound semiconductor layer further comprising an Al-free active layer made of $Ga_bIn_{1-b}P$ wherein $0.51 < b \leq 0.64$ and first and second clad layers sandwiching the active layer therebetween, said first clad layer being formed on said substrate, each clad layer being made of $(Al_cGa_{1-c})_dIn_{1-d}P$, wherein $0.4 \leq c \leq 1$ and $0.51 < d \leq 0.64$.

2. The semiconductor laser device according to claim 1, wherein said substrate has a lattice constant of from 0.560 to 0.5675.

3. The semiconductor laser device according to claim 1, further comprising a buffer layer provided between said substrate and said first clad layer.

4. The semiconductor laser device according to claim 3, wherein said buffer layer is made of a semiconductor selected from the group consisting of $Si_eGe_{1-e}$, wherein $0 < e \leq 0.25$, $GaAs_fP_{1-f}$ wherein $0.75 \leq f \leq 1$, and $Ga_gIn_{1-g}P$ wherein $0.25 \leq g \leq 0.64$.

5. The semiconductor laser device according to claim 3, further comprising an intermediate layer between said buffer layer and said first clad layer.

6. The semiconductor laser device according to claim 1, further comprising an insulating layer and a first electrode formed on said second clad layer in this order and a second electrode formed on the other side of said substrate.

7. The semiconductor laser device according to claim 1, wherein said substrate and said first clad layer are both of one conductivity type and said second clad layer is of the other conductivity type.

* * * * *